(12) United States Patent
Liu et al.

(10) Patent No.: US 8,062,472 B2
(45) Date of Patent: Nov. 22, 2011

(54) METHOD OF CORRECTING BASELINE SKEW BY A NOVEL MOTORIZED SOURCE COIL ASSEMBLY

(75) Inventors: Wei Liu, San Jose, CA (US); Johanes F. Swenberg, Los Gatos, CA (US); Hanh D. Nguyen, San Jose, CA (US); Son T. Nguyen, San Jose, CA (US); Roger Curtis, Stockton, CA (US); Philip A. Bottini, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 870 days.

(21) Appl. No.: 11/960,246

(22) Filed: Dec. 19, 2007

(65) Prior Publication Data

US 2009/0159425 A1  Jun. 25, 2009

(51) Int. Cl.
*C23C 16/00* (2006.01)
*H01L 21/306* (2006.01)
(52) U.S. Cl. ........... 156/345.48; 118/723 I; 118/723 AN
(58) Field of Classification Search .............. 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 4,512,841 A | 4/1985 | Cunningham, Jr. et al. | |
| 5,110,407 A | 5/1992 | Ono et al. | |
| 5,846,883 A | 12/1998 | Moslehi | |
| 5,888,413 A | 3/1999 | Okumura et al. | |
| 5,975,013 A | 11/1999 | Holland et al. | |
| 6,054,013 A | 4/2000 | Collins et al. | |
| 6,095,083 A | 8/2000 | Rice et al. | |
| 6,229,264 B1 | 5/2001 | Ni et al. | |
| 6,251,241 B1 * | 6/2001 | Shin et al. | 204/298.11 |
| 6,331,754 B1 * | 12/2001 | Satoyoshi et al. | 315/111.51 |
| 6,414,648 B1 | 7/2002 | Holland et al. | |
| 6,685,798 B1 | 2/2004 | Holland et al. | |
| 7,226,524 B2 | 6/2007 | Kasai et al. | |
| 7,504,041 B2 | 3/2009 | Chandrachood et al. | |
| 2003/0044529 A1 | 3/2003 | Wu et al. | |
| 2004/0083971 A1 | 5/2004 | Holland et al. | |
| 2004/0163764 A1 | 8/2004 | Collins et al. | |
| 2004/0242021 A1 | 12/2004 | Kraus et al. | |

(Continued)

FOREIGN PATENT DOCUMENTS

WO  WO-2007/130490 A  * 11/2007

OTHER PUBLICATIONS

PCT International Search Report and Written Opinion dated May 29, 2009 for International Application No. PCT/US2008/086881. (APPM/012089 PCT).

*Primary Examiner* — Luz L. Alejandro
(74) *Attorney, Agent, or Firm* — Patterson & Sheridan, L.L.P.

(57) ABSTRACT

The present invention generally provides apparatus and method for adjusting plasma density distribution in an inductively coupled plasma chamber. One embodiment of the present invention provides an apparatus configured for processing a substrate. The apparatus comprises a chamber body defining a process volume configured to process the substrate therein, and a coil assembly coupled to the chamber body outside the process volume, wherein the coil assembly comprises a coil mounting plate, a first coil antenna mounted on the coil mounting plate, and a coil adjusting mechanism configured to adjust the alignment of the first coil antenna relative to the process volume.

19 Claims, 12 Drawing Sheets

U.S. PATENT DOCUMENTS

| | | |
|---|---|---|
| 2005/0145341 A1* | 7/2005 | Suzuki .................... 156/345.49 |
| 2006/0029747 A1 | 2/2006 | Cruse et al. |
| 2007/0256784 A1 | 11/2007 | Chandrachood et al. |
| 2007/0256787 A1 | 11/2007 | Chandrachood et al. |
| 2007/0257008 A1 | 11/2007 | Chandrachood et al. |
| 2007/0257009 A1 | 11/2007 | Chandrachood et al. |

* cited by examiner

METHOD OF CORRECTING BASELINE SKEW BY A NOVEL MOTORIZED SOURCE COIL ASSEMBLY

BACKGROUND OF THE INVENTION

1. Field of the Invention

Embodiments of the present invention generally relate to method and apparatus for processing a semiconductor substrate. More particularly, embodiments of the present invention provide method and apparatus for correcting baseline skew in an inductively coupled plasma reactor.

2. Description of the Related Art

Plasma reactors used to fabricate semiconductor microelectronic circuits can employ RF (radio frequency) inductively coupled fields to maintain a plasma formed from a processing gas. Conventional inductively coupled plasma reactors generally includes a vacuum chamber having a side wall and a ceiling, a workpiece support pedestal within the chamber and generally facing the ceiling, a gas inlet capable of supplying a process gas into the chamber, and one or more solenoidal interleaved parallel conductor coil antennas overlying the ceiling. The one or more coil antennas are generally wound about an axis of symmetry generally perpendicular to the ceiling. A RF plasma source power supply is connected across each of the coil antennas. Sometimes, the reactor may include an inner coil antenna overlying the ceiling and surrounded by an outer coil antenna.

Typically, a high frequency RF source power signal is applied to the one or more coil antennas near the reactor chamber ceiling. A substrate disposed on a pedestal within the chamber which may have a bias RF signal applied to it. The power of the signal applied to the coil antenna primarily determines the plasma ion density within the chamber, while the power of the bias signal applied to the substrate determines the ion energy at the wafer surface.

Typically with "inner" and "outer" coil antennas, the coils are distributed radially or horizontally (rather than being confined to a discrete radius) so that their radial location is diffused accordingly. The radial distribution of plasma ion distribution is changed by changing the relative apportionment of applied RF power between the inner and outer antennas. However, it becomes more difficult to maintain a uniform plasma ion density across the entire wafer surface as wafers become larger and device feature become smaller.

FIG. 1 schematically illustrates non-uniformity problems cased by baseline skew encountered by typical inductively coupled plasma reactors. FIG. 1 is a result showing nitrogen dosages across a substrate after nitridation processes preformed in a typical inductively coupled plasma reactor. The nitridation processes are performed to silicon dioxide gate dielectric film formed on a substrate. The substrate is positioned in a vacuum chamber capable of generating inductively coupled plasma. Nitrogen gas is flown to the plasma chamber and a plasma is struck while the flow continuous. The nitrogen radicals and/or nitrogen ions in the nitrogen plasma then diffuse and/or bombard into the silicon dioxide gate dielectric film.

FIG. 1 is a contour graph showing nitrogen dosage across surface of an entire surface of a 300 mm substrate after nitridation performed in an inductively coupled plasma reactor. The asymmetrical distribution of nitrogen dosage shown in the contour graph is commonly referred to as "baseline skew". Skew reflects asymmetry of the plasma and may be a result of multiple factors either inherited from the chamber or contributed by the process recipe, for example, asymmetry of the coils, flow rate distribution, chamber structure, species in the processing gas, changes of flow rate, power level of RF source applied, and other external factors from the processing chamber.

Therefore, there is a need to have a plasma reactor with a capacity to correct degrees of baseline skew during process.

SUMMARY OF THE INVENTION

The present invention generally provides apparatus and method for adjusting plasma density distribution in an inductively coupled plasma chamber. Particularly, the present invention provides method and apparatus for adjusting positions of coil antennas in relation to a processing volume in an inductively coupled plasma reactor.

One embodiment of the present invention provides an apparatus configured for processing a substrate. The apparatus comprises a chamber body defining a process volume configured to process the substrate therein, and a coil assembly coupled to the chamber body outside the process volume, wherein the coil assembly comprises a coil mounting plate, a first coil antenna mounted on the coil mounting plate, and a coil adjusting mechanism configured to adjust the alignment of the first coil antenna relative to the process volume.

Another embodiment of the present invention provides an apparatus for processing a semiconductor substrate. The apparatus comprises a chamber body defining a process volume configured to process the semiconductor substrate therein, and a coil assembly coupled to the chamber body outside the process volume, wherein the coil assembly comprises a coil mounting plate, an inner coil mounted to the coil mounting plate, an outer coil mounted to the coil mounting plate, wherein the outer coil is positioned concentrically outward to the inner coil, and a coil adjusting mechanism configured to adjust the alignment of at least one of the inner coil and the outer coil relative to the process volume.

Yet another embodiment of the present invention a method for adjusting plasma density distribution in a plasma reactor. The method comprises providing a chamber body defining a process volume, providing one or more coil antennas configured to strike a inductively coupled plasma within the process volume, flowing a processing gas to the process volume, striking a plasma of the processing gas by supplying radio frequency power to the one or more coil antennas, and adjusting relative position of the one or more coil antennas to the process volume to adjust plasma density distribution in the process volume.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides apparatus and methods for processing a semiconductor substrate using inductively coupled plasma. Embodiments of the present invention provide inductively coupled plasma reactors having features that provide improved uniformity. Particularly, the inductively coupled plasma reactors of the present invention comprises adjustable coils to reduce non-uniformity in the form of skew, a substrate assembly capable of adjusting edge profile, and an gas inject assembly having independently adjustable gas injects.

Figure 1:
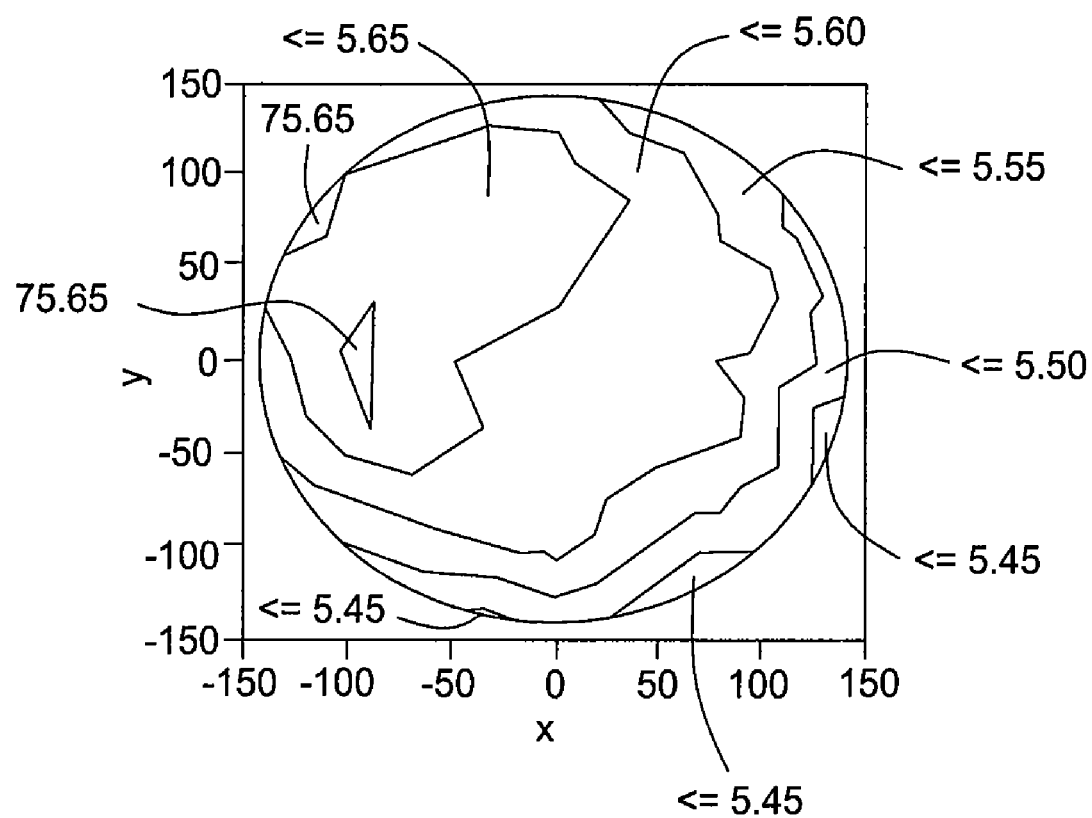
FIG. 1 schematically illustrates a baseline skew encountered by typical inductively coupled plasma reactors.
Figure 2:
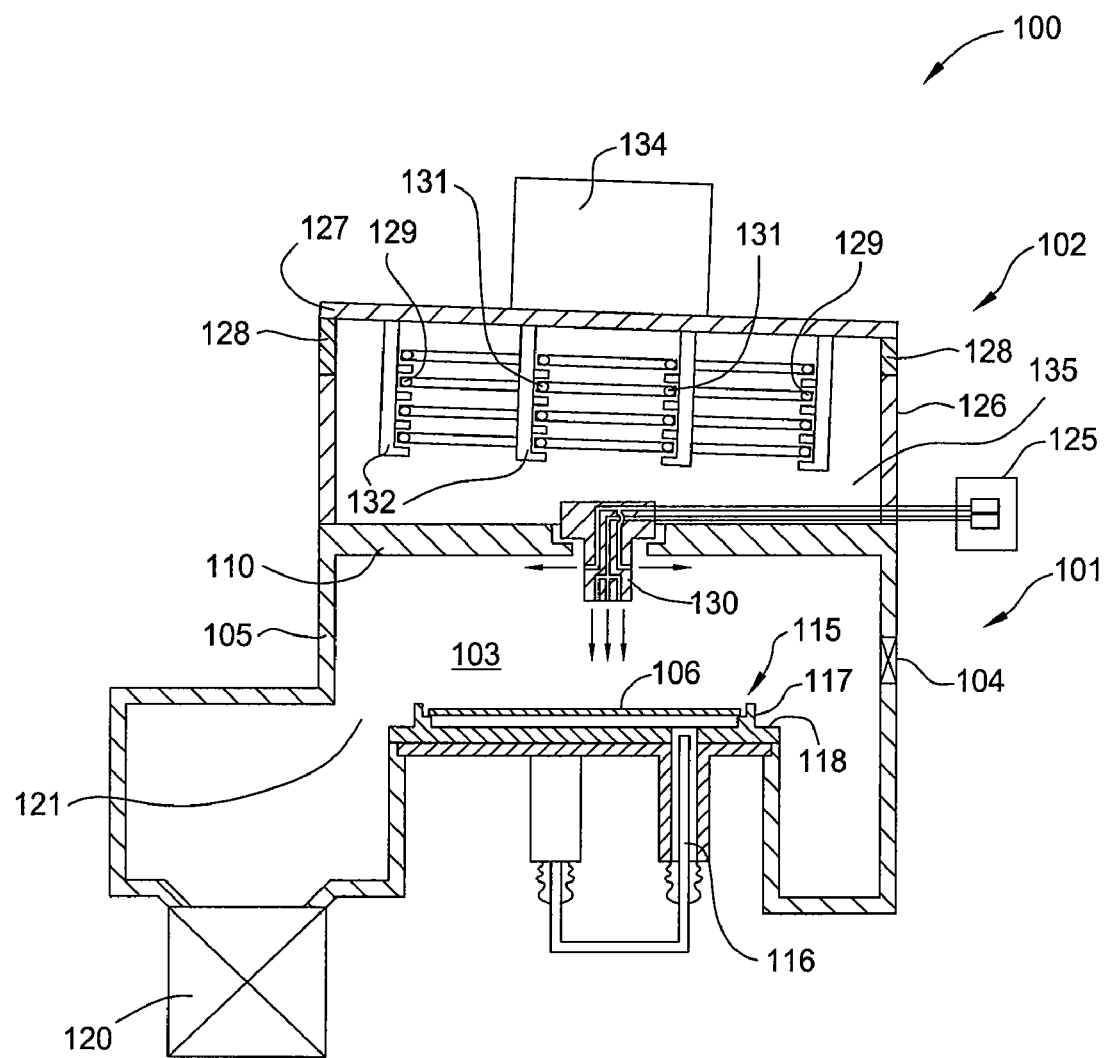
FIG. 2 schematically illustrates a sectional side view of a plasma reactor in accordance with one embodiment of the present invention.

FIG. 2 schematically illustrates a sectional side view of a plasma reactor 100 in accordance with one embodiment of the present invention. The plasma reactor 100 generally comprises a reactor chamber 101 and an antenna assembly 102 positioned above the reactor chamber 101. The antenna assembly 102 is configured to generate inductively coupled plasma in the reactor chamber 101.

The reactor chamber 101 has a process volume 103 defined by a cylindrical side wall 105 and a flat ceiling 110. A substrate support pedestal 115 is disposed within the reactor chamber 101, oriented in facing relationship to the flat ceiling 110 and centered on the chamber axis of symmetry. The substrate support pedestal 115 is configured to support a substrate 106 thereon. The substrate support pedestal 115 comprises a supporting body 117 configured to receive and support the substrate 106 during process. In one embodiment, the substrate support pedestal 115 has an edge surface 118 circumscribing the substrate 106. The relative height between the edge surface 118 and the substrate 106 is configured to adjust processing results near the edge of the substrate 106.

A plurality of supporting pins 116 are movably disposed on the substrate support pedestal 115 and are configured to facilitate substrate transporting. A vacuum pump 120 cooperates with a vacuum port 121 of the reactor chamber 101. A slit valve port 104 is formed on the cylindrical side wall 105 allowing transporting of substrates in and out of the process volume 103.

A process gas supply 125 furnishes process gas into the process volume 103 through a gas inlet 130. The gas inlet 130 may be centered on the flat ceiling 110 and has a plurality of gas inject ports directing gas to different regions of the process volume 103. In one embodiment, the gas inlet 130 may be configured to supply individually adjustable flow of process gas to different regions of the process volume 103 to achieve desired distribution of process gas within the process volume 103.

The antenna assembly 102 comprises a cylindrical side wall 126 disposed on the flat ceiling 110 of the reactor chamber. A coil mounting plate 127 is movably disposed on the side wall 126. The side wall 126, the coil mounting plate 127, and the flat ceiling 110 generally define a coil volume 135. A plurality of coil hangers 132 extend from the coil mounting plate 127 in the coil volume 135. The plurality of coil hangers 132 are configured to position one or more coil antennas in the coil volume 135.

In one embodiment, an inner coil 131 and an outer coil 129 are arranged in the coil volume 135 to maintain a uniform plasma ion density across the entire substrate surface during process. In one embodiment, the inner coil 131 has a diameter of about 5 inches and the outer coil 129 has a diameter of about 20 inches. Detailed description of different designs of coil antennas may be found in U.S. Pat. No. 6,685,798, entitled "Plasma Reactor Having a Symmetric Parallel Conductor Coil Antenna", which is incorporated herein by reference.

Each of the inner coil 131 and the outer coil 129 may be a solenoidal multi-conductor interleaved coil antenna that defines a vertical right circular cylinder or imaginary cylindrical surface or locus whose axis of symmetry substantially coincides with that of the reactor chamber 101. It is desirable to have axis of the inner coil 131 and outer coil 129 to coincide with the axis of the axis of symmetry of the substrate 106 to be processed in the reactor chamber 101. However, the alignment among the inner coil 131, the outer coil 129, the reactor chamber 101, and the substrate 106 is susceptible to errors causing skews. The coil mounting plate 127 is movably positioned on the side walls 126 so that the inner coil 131 and the outer coil 129 may be tilted relative to the reactor chamber 101, together or independently. In one embodiment, the coil mounting plate 127 may be adjusted rotating a tilt ring 128 positioned between the coil mounting plate 127 and the side wall 126. The tilt ring 128 has a variable thickness which enables a tilted mounting of the coil mounting plate 127.

The plasma reactor 100 further comprises a power assembly 134 configured to provide power supply to the inner coil 131 and the outer coil 129. The power assembly 134 generally comprises RF power supplies and matching networks. In one embodiment, the power assembly 134 may be positioned above the coil mounting plate 127.

More detailed description of the plasma reactor 100 may be found in U.S. Pat. application Ser. No. 11/960,111, filed Dec. 19, 2007, entitled "Apparatus and Method for Processing a Substrate Using Inductively Coupled Plasma Technology", which is incorporated herein by reference.

As discussed above, asymmetric alignment of coil antennas is one of the reasons causing baseline skew. Embodiments of the present invention provide plasma reactors having adjustable coil assemblies for correcting baseline skew. In one embodiment, at least one coil antenna is adjustable relative to a process volume of a plasma chamber to compensate asymmetry of structure and flow rate.

Figure 3A:
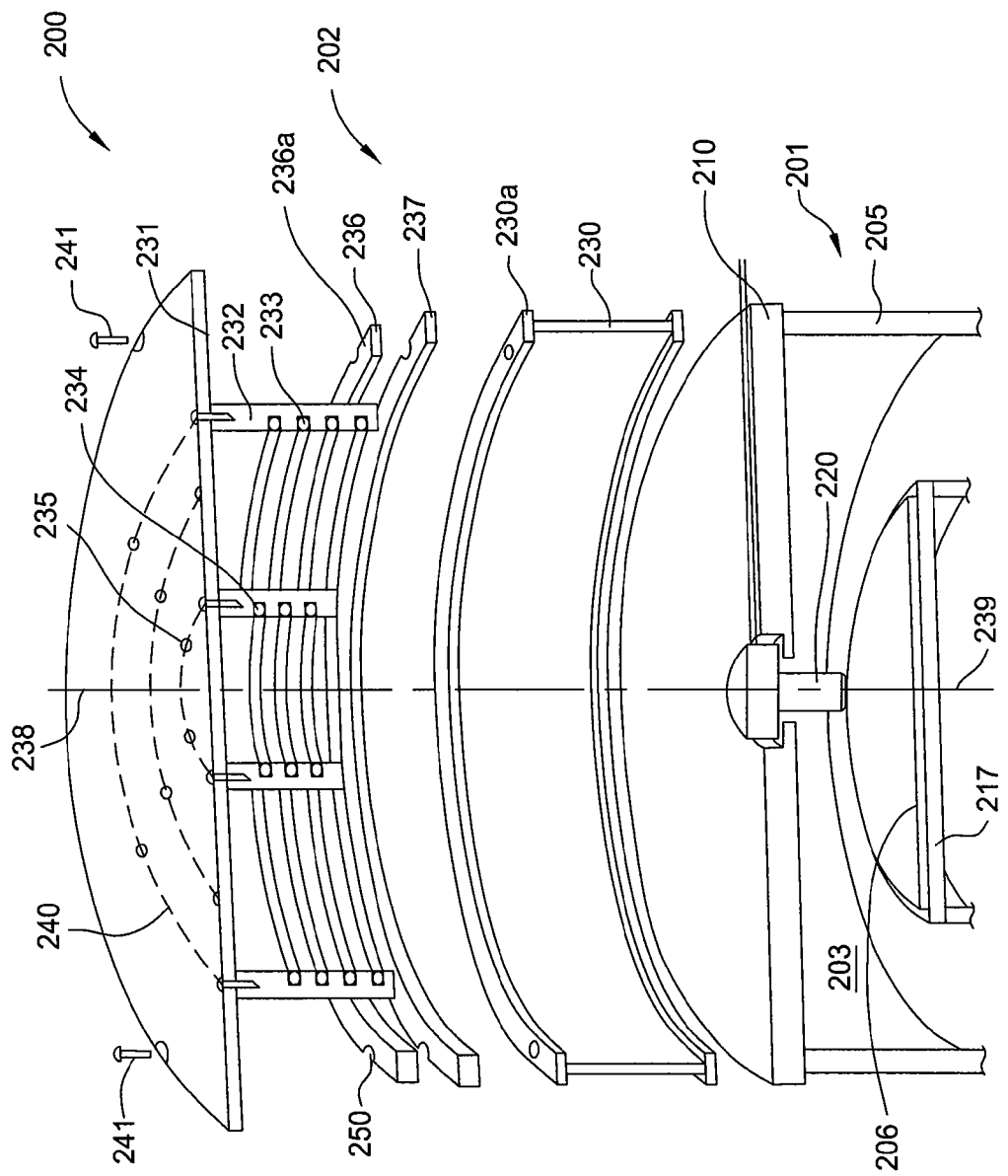
FIG. 3A schematically illustrates an exploded sectional view of a coil assembly in accordance with one embodiment of the present invention.

FIG. 3A schematically illustrates a partial exploded sectional view of a plasma reactor 200 having a coil assembly 202 in accordance with one embodiment of the present invention.

The coil assembly 202 is configured to generate plasma in any processing chamber configured to process circular semiconductor substrates. As shown in FIG. 3A, the coil assembly 202 may be coupled to a plasma chamber 201 outside a process volume 203 of the plasma chamber 201. The plasma chamber 201 comprises a cylindrical sidewall 205, a lid 210 having a gas inlet 220, and a substrate support 217 configured to support a substrate 206. The plasma chamber 201 may be designed to be substantially symmetrical to a central axis 239. The lid 210 and the substrate support 217 are configured to be aligned with the central axis 239.

The coil assembly 202 comprises a cylindrical sidewall 230 coupled to the lid 210 of the plasma chamber 201. The cylindrical sidewall 230 is aligned to be symmetrical about the central axis 239. Tilting rings 236, 237 are stacked on a flange 230a of the cylindrical sidewall 230. A coil mounting plate 231 is coupled to the cylindrical sidewall 230 via the tilting rings 236, 237. Each of the tilting rings 236, 237 varies in thickness. By rotating the stacked tilting ring 236, 237 relative to each other, a top surface 236a of the tilting ring 236 may be tilted at various degrees and at various directions. The angle of the coil mounting plate 231 may therefore be adjusted. The stacked tilting rings 236, 237 can be rotated together to adjust tilting angle of the top surface 236a and the coil mounting plate.

The coil mounting plate 231 may have a plurality of hanger mounting holes 235 configured to couple coil hangers 232 to the coil mounting plate 231. The plurality of hanger mounting holes 235 are arranged in a plurality of concentric circles 240 for mounting of coil antennas of different diameters. The circles 240 are centered around a center axis 238 of the coil mounting plate 231. In one embodiment, an inner coil 234 and an outer coil 233 are disposed in the coil hangers 232. The inner coil 234 and the outer coil 233 are configured to maintain a substantially uniform plasma in the process volume 203. Diameter of the inner coil 234 and/or the outer coil 233 may be adjusted to achieve uniformity at different situations. In one embodiment, the inner coil 234 has a diameter of about 5 inches, and the outer coil 233 has a diameter of about 15 inches. The inner coil 234 and the outer coil 233 are positioned to be symmetrical about the central axis 238.

The tilting rings 236, 237 provide an adjustable plane for the coil mounting plate 231 to rest, thus, providing adjustment to alignment between the central axis 238 and the central axis 239, the alignment of the inner and outer coils 234, 233 with the central axis 238. The tilting rings 236, 237 also provide adjustment to compensate system asymmetry, for example, asymmetry caused by locations of a slit valve and a vacuum port in the chamber body.

Figure 3C:
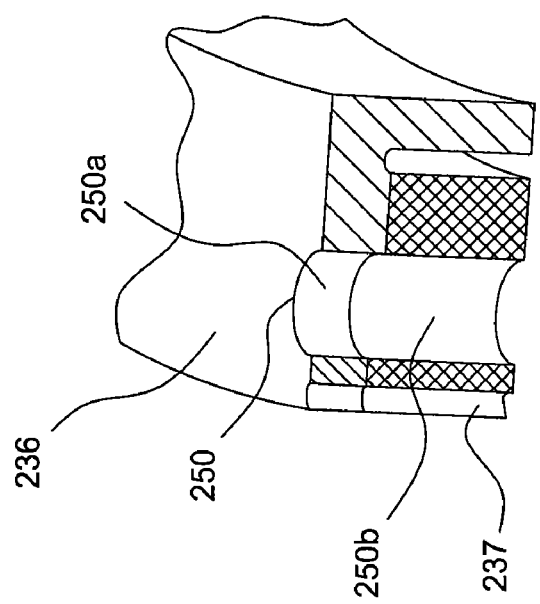
FIG. 3C schematically illustrates an enlarged sectional view of the tilting ring of FIG. 3B.
Figure 3B:
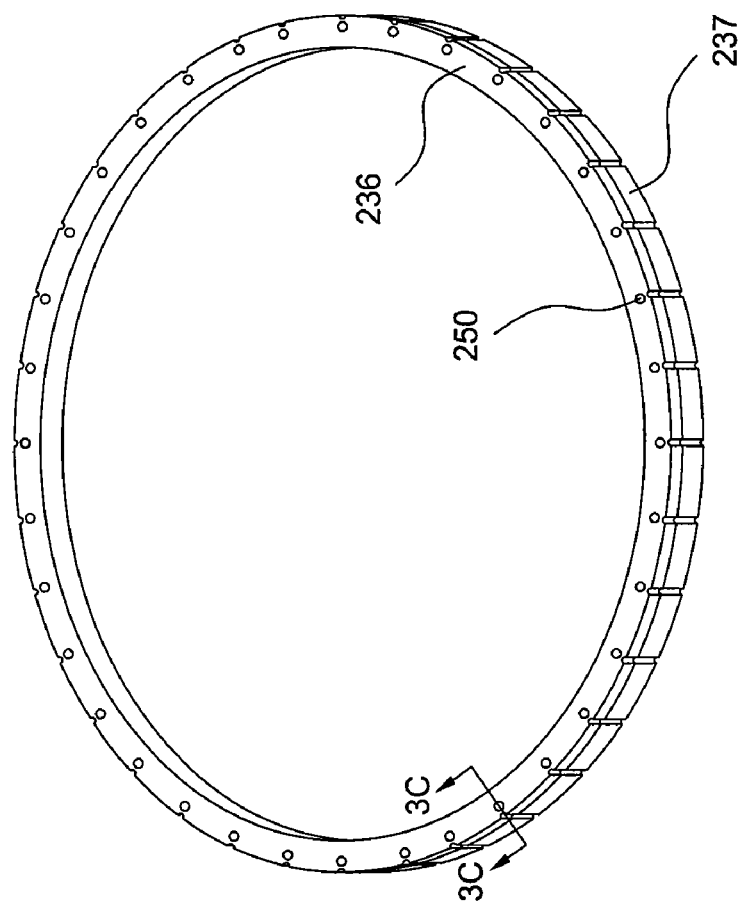
FIG. 3B schematically illustrates a tilting ring applicable to the coil assembly of FIG. 3A.

FIG. 3B schematically illustrates tilting rings used in the plasma reactor of FIG. 3A. FIG. 3C schematically illustrates an enlarged sectional view of the tilting rings of FIG. 3B. Each of the tilting ring 236, 237 gradually changes thickness along the periphery. The tilting rings 236, 237 are stackable to form a ring with various degree of thickness variation. The stacked ring may have a thickness variation of combined variation of the tilting ring 236 and the tilting ring 237 when stacked thinnest part to the thinnest part, and the thickest part to the thickest part. The stack ring may also be a ring with even thickness. In one embodiment, both tilting rings 236, 237 may have a plurality of locking holes 250a, 250b configured to form locking holes 250 to accommodate a locking screw 241 to lock the relative position of the tilting rings 236, 237 once a tilting angle is chosen. In one embodiment, the tilting rings 236, 237 may have a diameter of about 15 inches, and the thickness variation of the stacked ring may be from 0 to 1 inch.

Figure 3D:
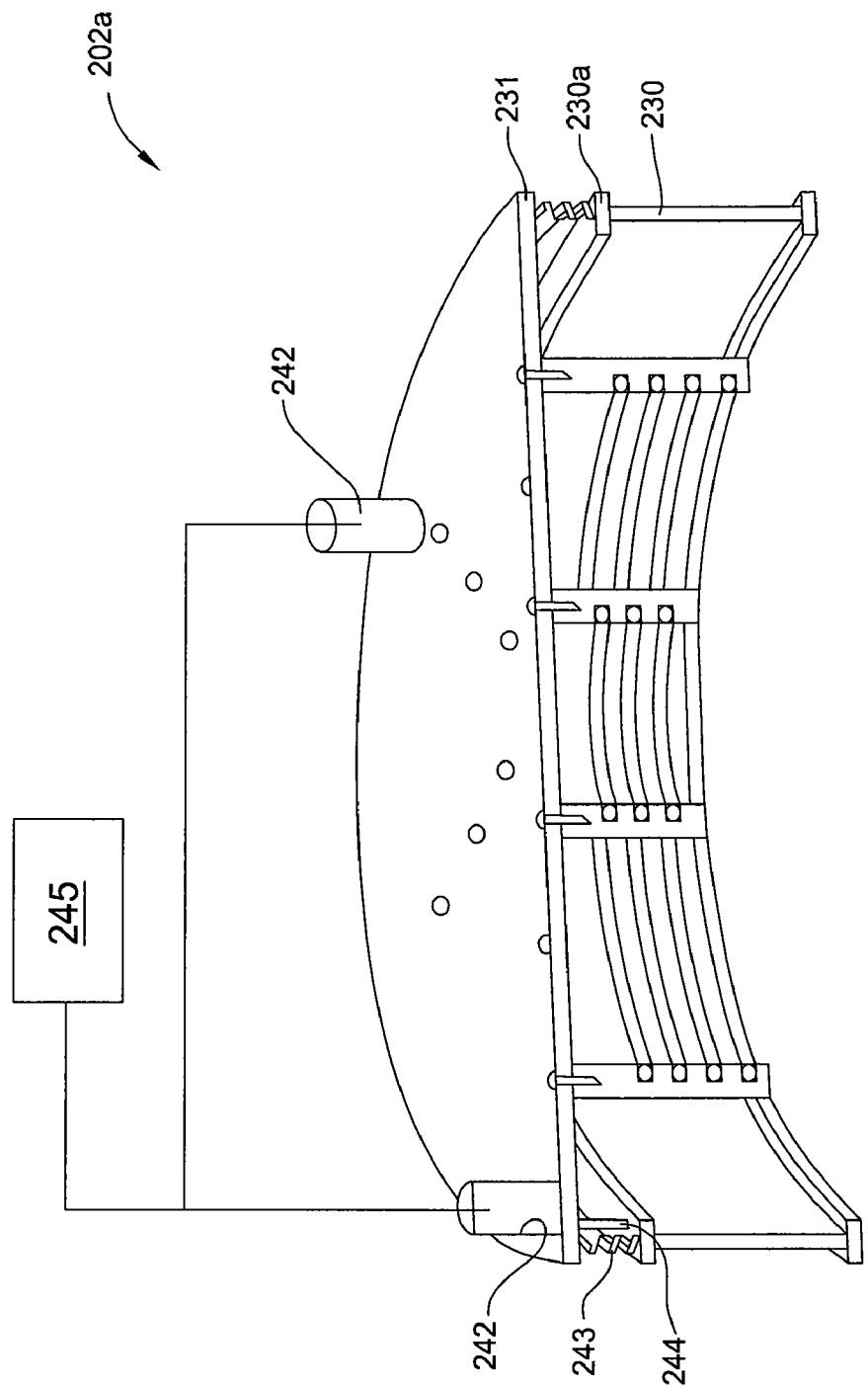
FIG. 3D schematically illustrates an exploded sectional view of a motorized coil assembly in accordance with one embodiment of the present invention.

FIG. 3D schematically illustrates an exploded sectional view of a motorized coil assembly 202a in accordance with one embodiment of the present invention. The motorized coil assembly 202a is similar to the coil assembly 202 of FIG. 3A except the coil mounting plate 231 is coupled to the cylindrical sidewall 230 via three or more lifts 243. Each lift 243 is motorized by a motor 242. In one embodiment, three lifts 243 are evenly distributed at 120 degrees apart. Each motor 242 is configured to independently change the elevation of each lift 243 coupled thereto. The three lifts 243 adjust tilting angle of the coil mounting plate 231 in a continuous manner.

In one embodiment, the motors 242 are coupled to a controller 245. The controller 245 may comprise software that coordinates the motors 242 to position the coil mounting plate 231 in a desired position. The controller 245 may adjust the motors 242 according to measurement of plasma density distribution in the process chamber. In one embodiment, the controller 245 may be configured to adjust the motors 242 according to different recipes.

The motorized coil assembly 202a further comprises a bellows 244 that connects between the cylindrical sidewall 230 and the coil mounting plate 231. The bellows 244 is made of conductive material and electronically connects the coil mounting plate 231 to the sidewall 230 which is typically grounded. The bellows 244 also provides RF shielding.

As described above, positions of the coil antennas relative to the process chamber may be adjusted by adjusting the mounting plate. It is contemplated that the relative positions of the coil antennas among one other may be adjusted by adjusting each coil antenna individually.

Figure 3E:
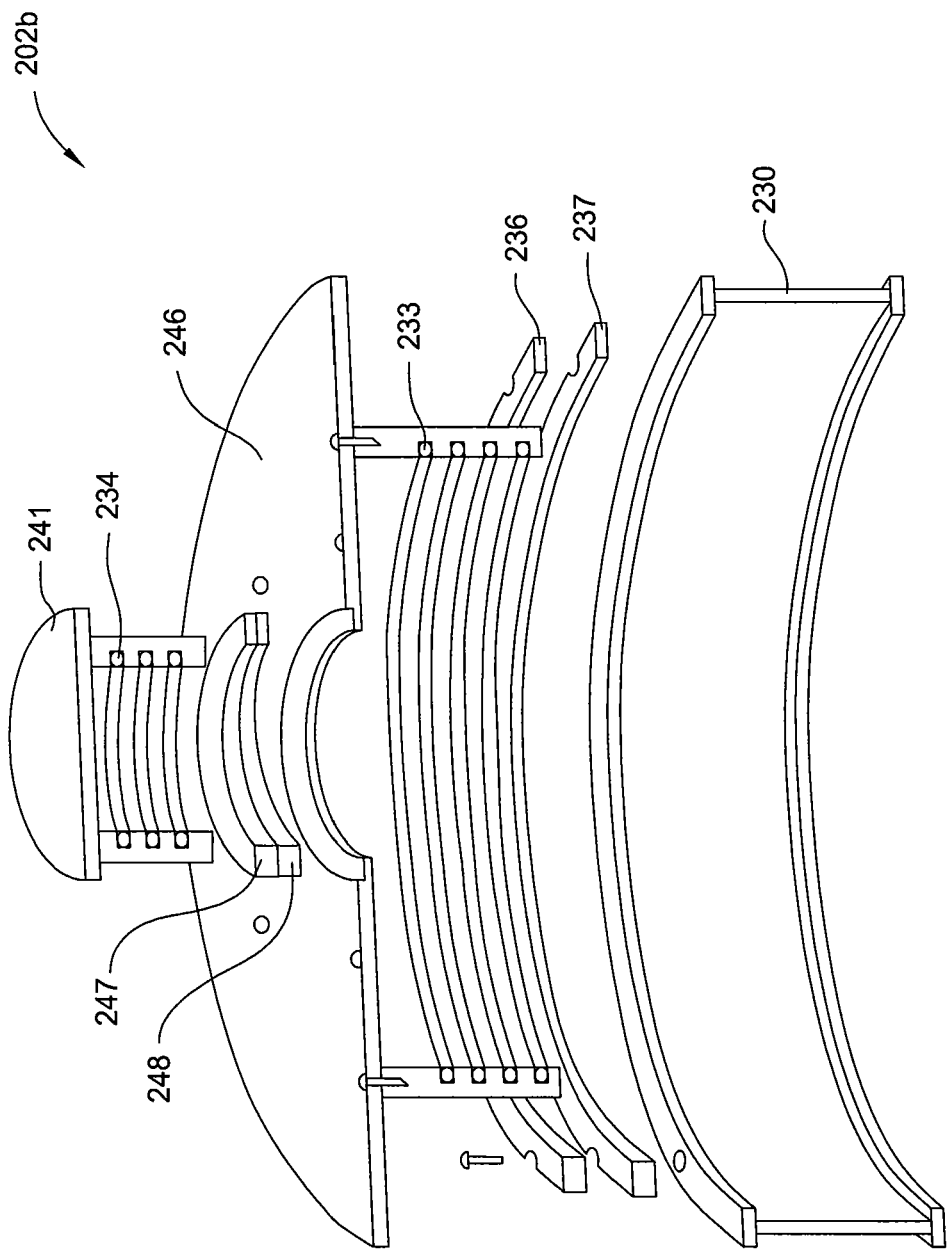
FIG. 3E schematically illustrates an exploded sectional view of a coil assembly in accordance with another embodiment of the present invention.

FIG. 3E schematically illustrates an exploded sectional view of a coil assembly 202b in accordance with another embodiment of the present invention. The motorized coil assembly 202b is similar to the coil assembly 202 of FIG. 3A except the coil mounting plate 246 further comprise an inner coil mounting plate 249 that is adjustably coupled thereon. Inner tilting rings 247, 248 are used to adjust the relative tilting angle of the inner coil 234 to the outer coil 233. The inner tilting rings 247, 248 are similar to the tilting rings 236, 237.

Figure 4A:
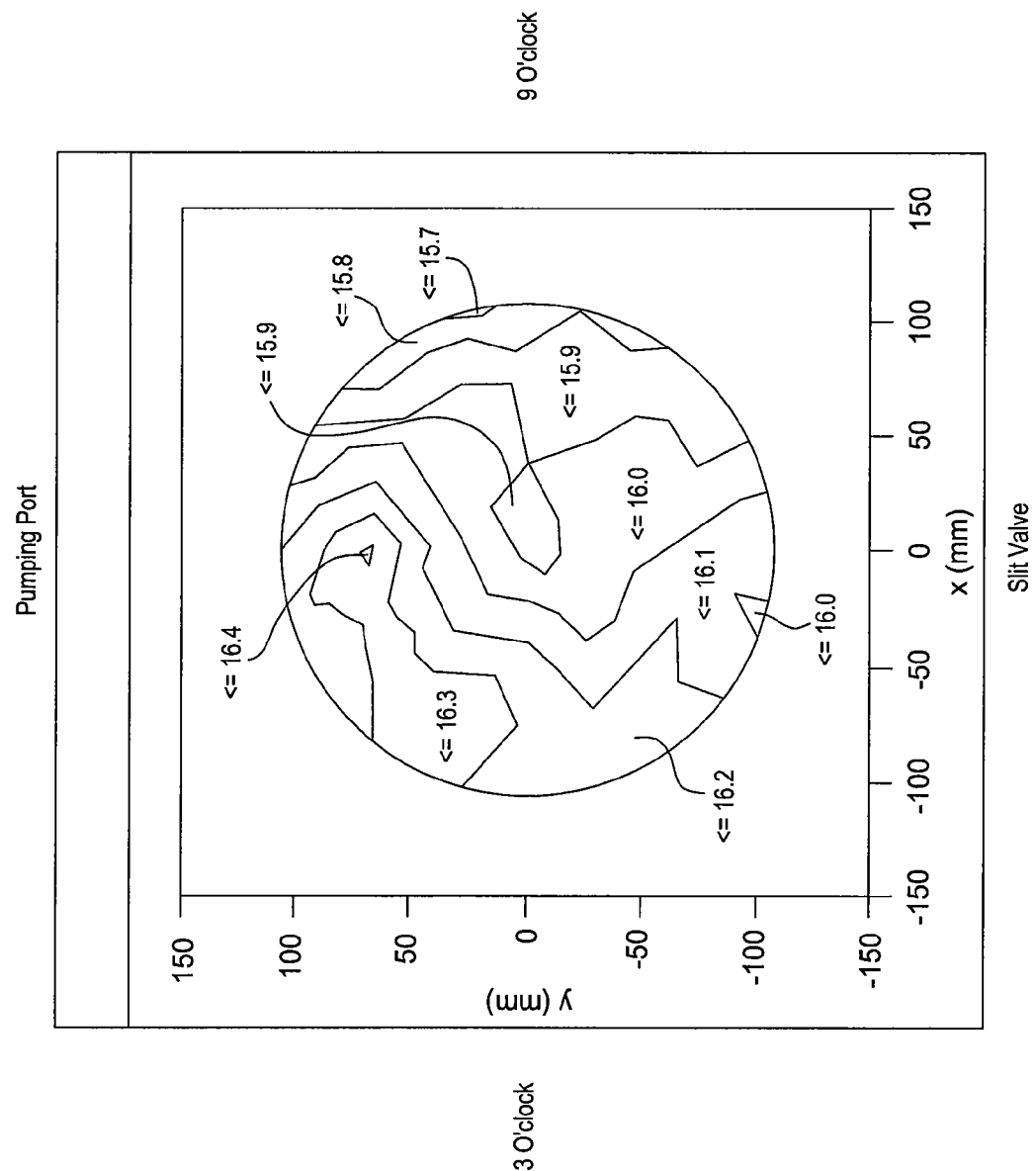
FIGS. 4A-4C are contour graphs showing adjustment of baseline skew by tilting a coil assembly during a high dose process.
Figure 4B:
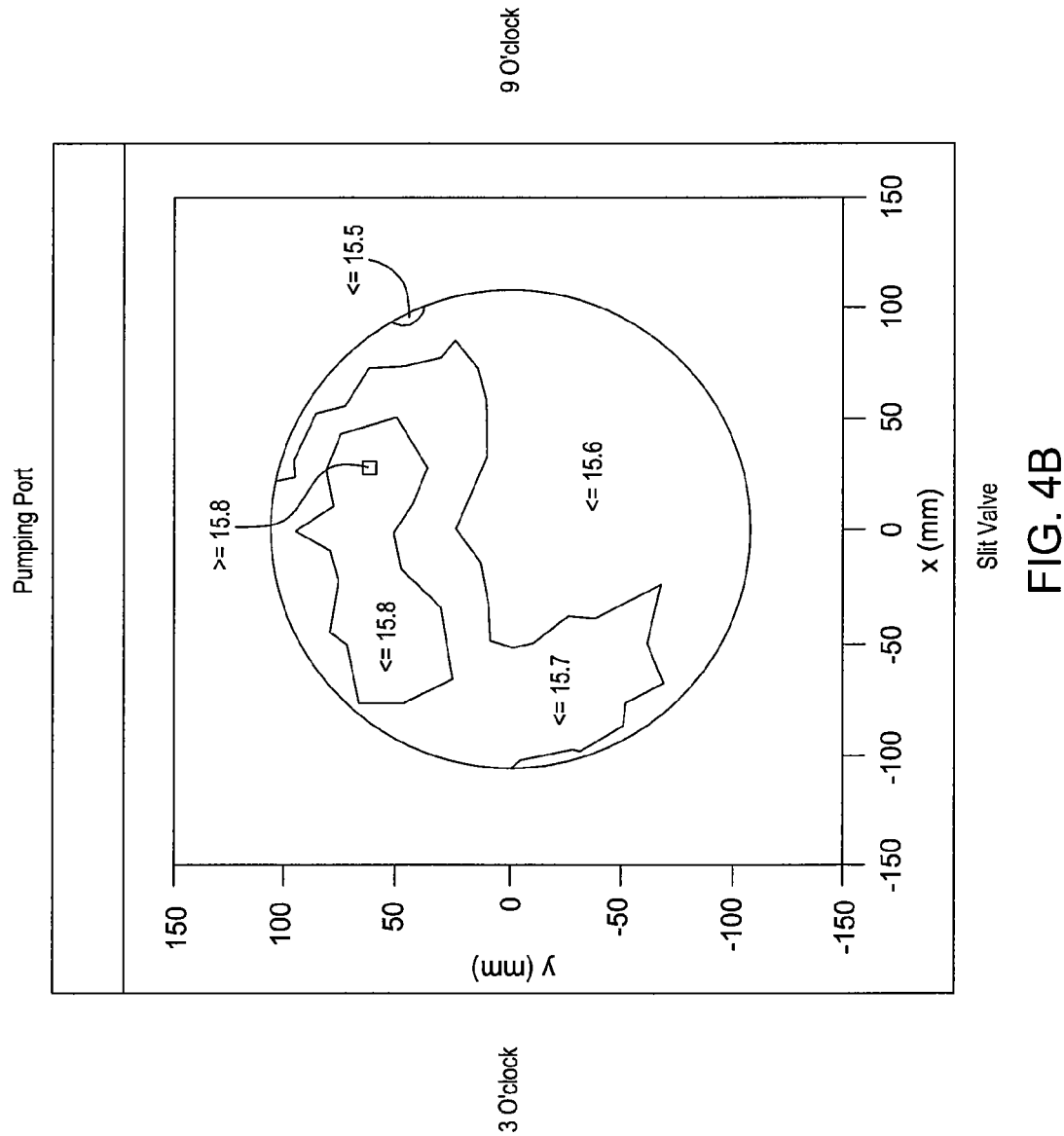
Figure 4C:
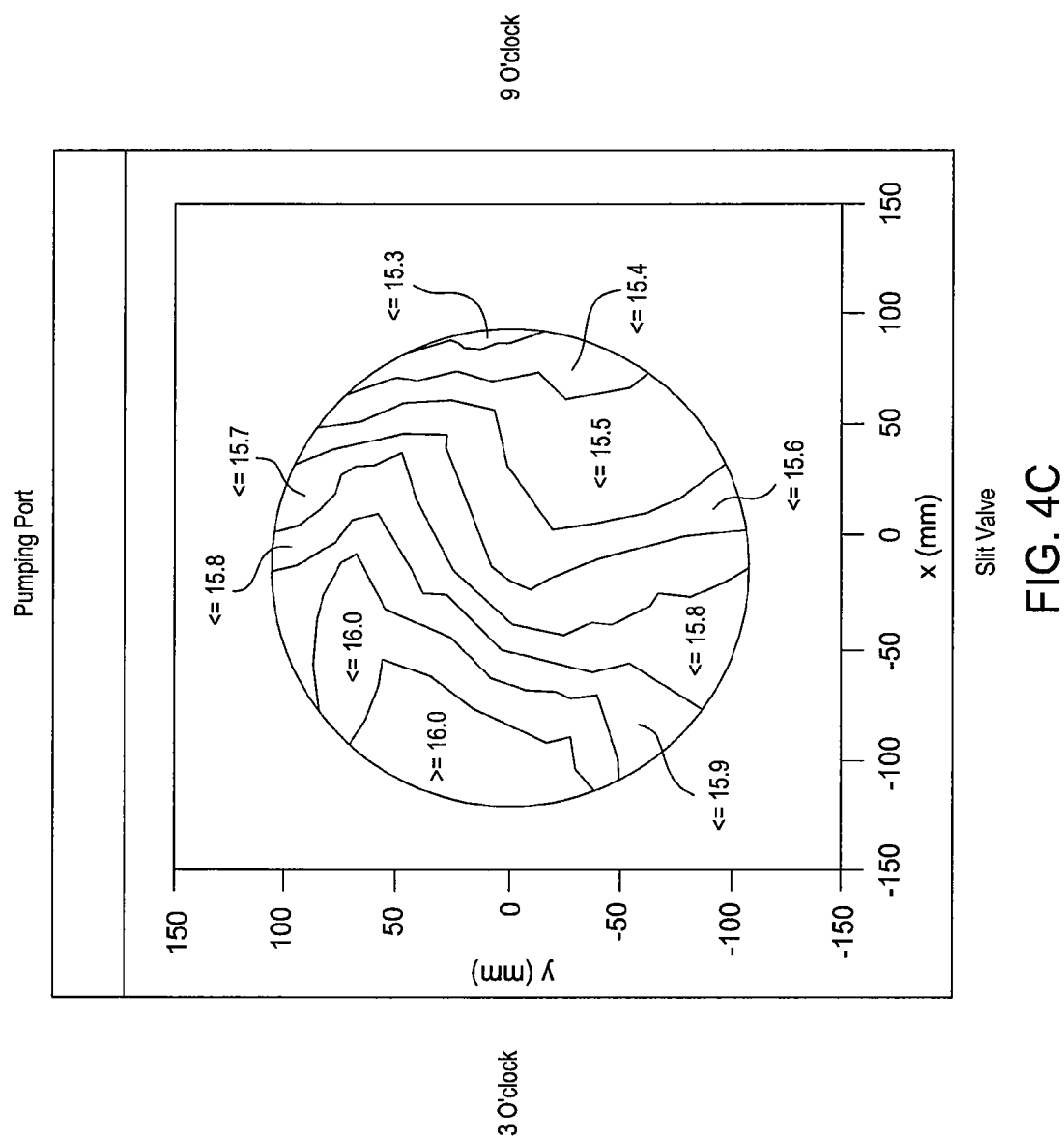

FIGS. 4A-4C are contour graphs of nitrogen dosage across a substrate after nitridation processes performed in the plasma reactor having an adjustable coil assembly. The nitridation process is generally performed to silicon dioxide gate dielectric film formed on a substrate. The substrate is positioned in the plasma reactor, for example, the plasma reactor 100 of FIG. 2. Nitrogen gas is flown to the plasma chamber and a plasma is struck by a coil assembly, such as the coil assembly 202 of FIG. 3A and the coil assembly 202a of FIG. 3D, while the nitrogen flow continuous. The plasma ionizes the nitrogen and the ionized nitrogen then diffuses into the silicon dioxide gate dielectric film.

FIG. 4A illustrates a contour graph of nitrogen dosage after a high dose nitridation process where coil positions are not adjusted. The result in FIG. 4A shows a typical baseline skew. The nitrogen dosage generally decreases from left (3 O'clock) to right (9 O'clock).

To correct the skew showing in FIG. 4A, the coils used to generate plasma may be tilted for about 0.6 inches near the end with high dosage, 3 O'clock. FIG. 4B illustrates a contour graph of nitrogen dosage after a high dose nitridation process similar to the process shown in FIG. 4A after raising the coil assembly by 0.6 inch near the 3 O'clock location. As shown in FIG. 4B, the degree of skew has been reduced compared to the result shown in FIG. 4A.

FIG. 4C illustrates a contour graph of nitrogen dosage after a high dose nitridation process similar to the process shown in FIG. 4A after raising the coil assembly by 0.6 inch near the 9 O'clock position. As shown in FIG. 4C, the degree of skew has been increased compared to the result shown in FIG. 4A.

Figure 5A:
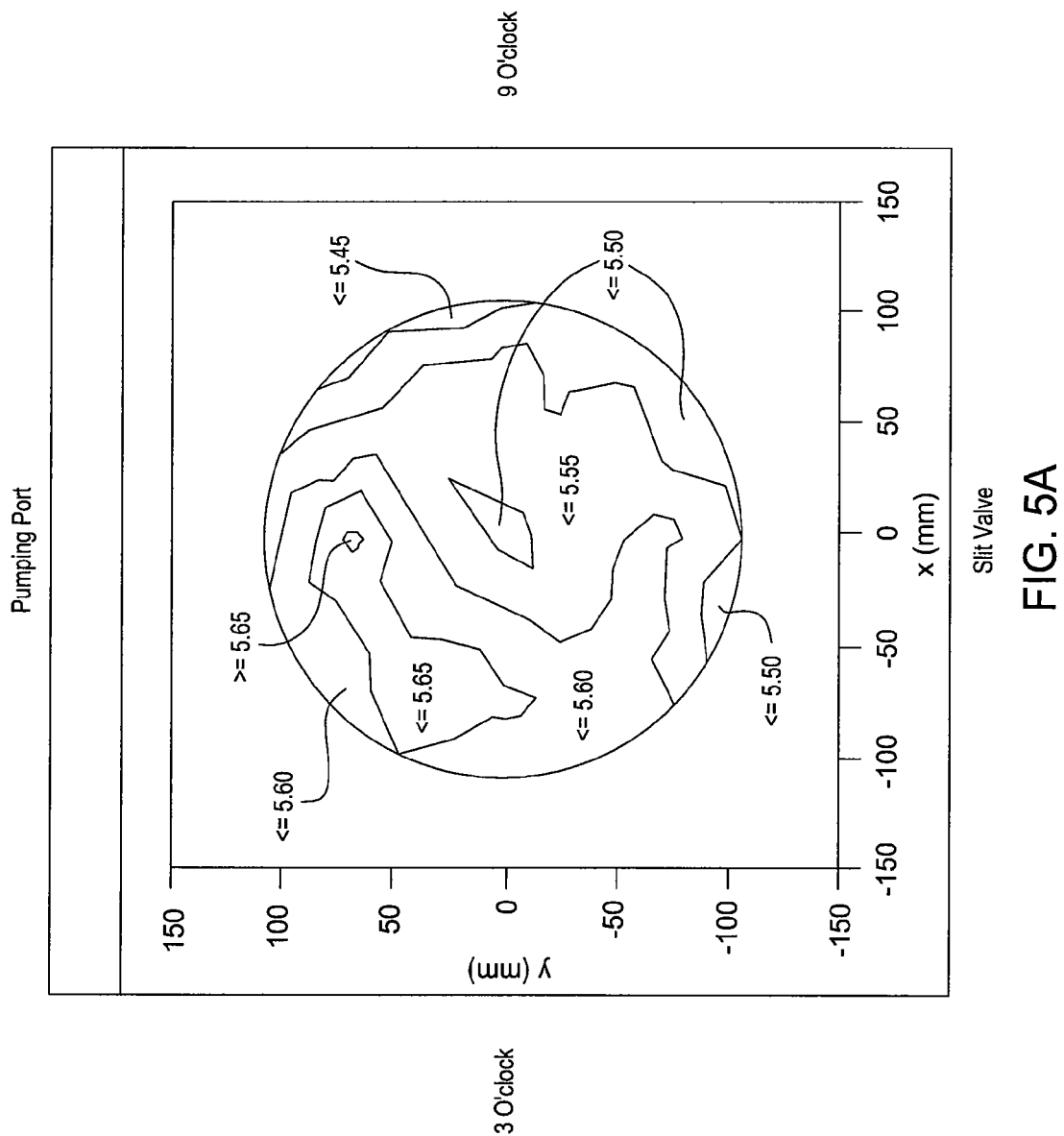
FIGS. 5A-5C are contour graphs showing adjustment of baseline skew by tilting a coiling assembly during a medium dose process.
Figure 5B:
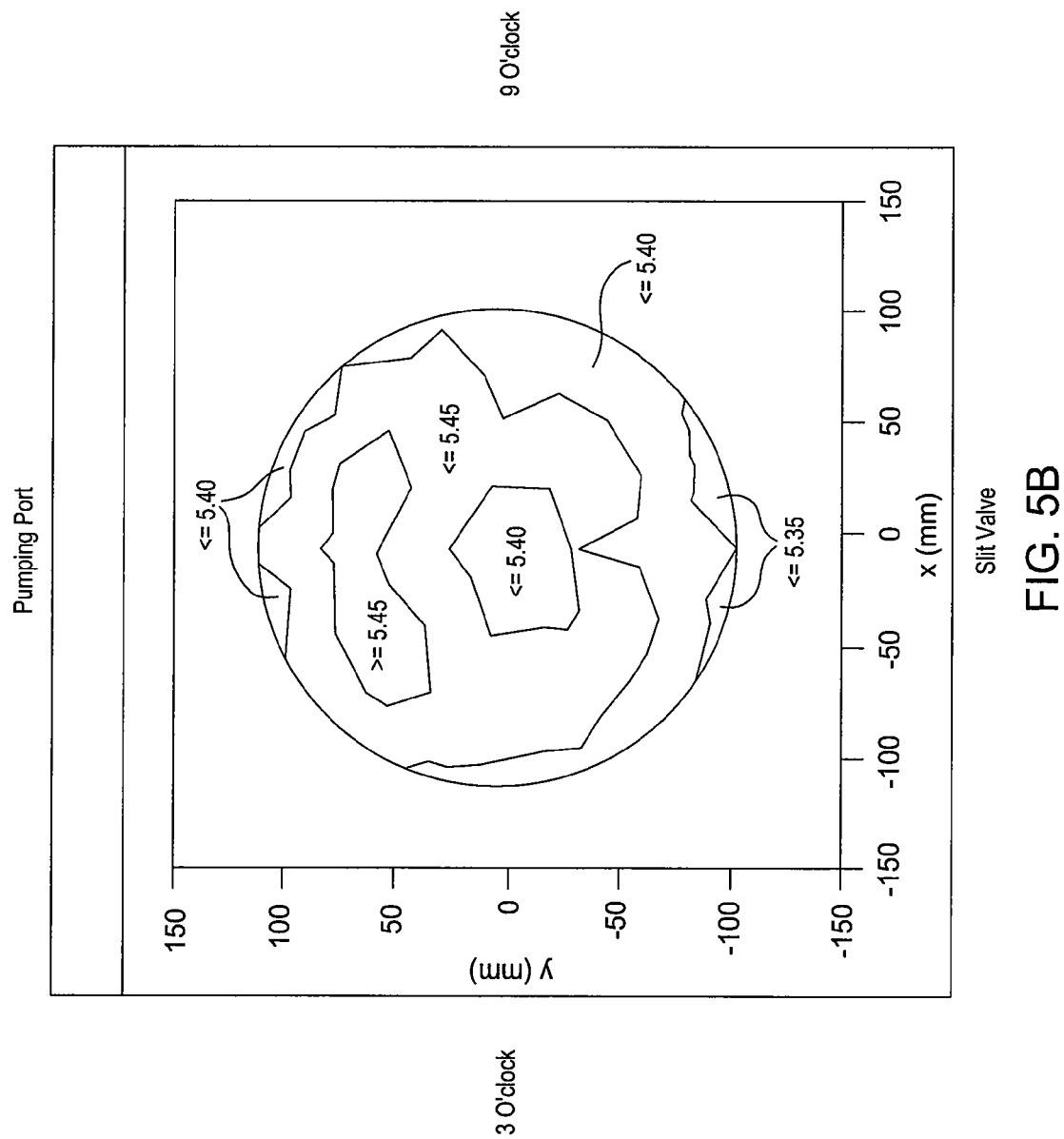
Figure 5C:
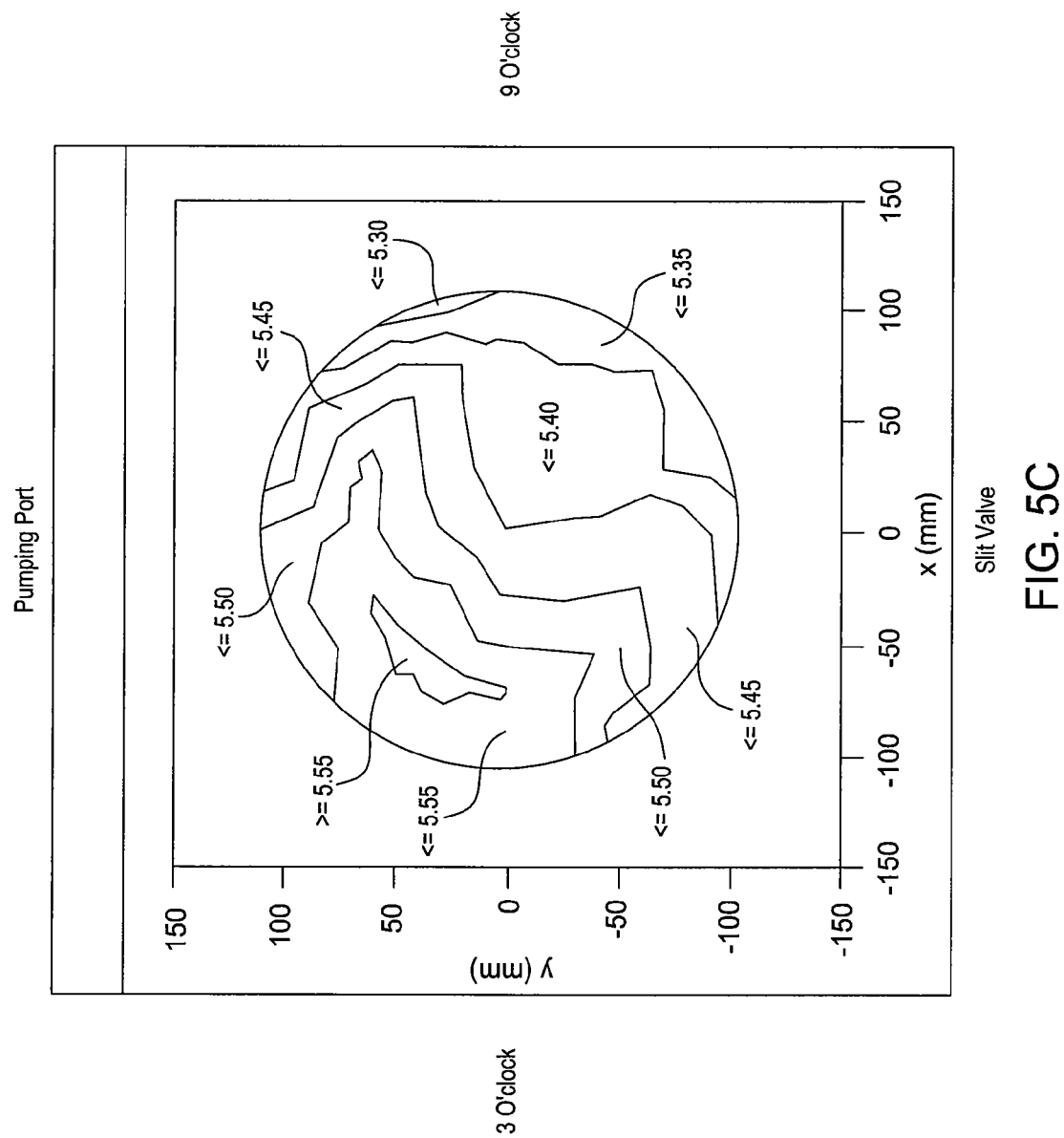

Similarly, FIGS. 5A-5C are contour graphs showing correction of baseline skew by tilting a coiling assembly during a medium dose process. FIG. 5A illustrates a contour graph of nitrogen dosage after a medium dose nitridation process where coil positions are not adjusted.

The result in FIG. 5A shows a baseline skew which is different from the baseline skew of FIG. 4A even though the coil setting are the same in the two process. Therefore, it is obvious that process parameters affect the baseline skew in addition to the coil-chamber positioning.

FIG. 5B shows a result nitrogen dosage after the coils used to generate plasma are tilted for about 0.6 inches near the end with high dosage, near the 3 O'Clock position. As shown in FIG. 5B, the degree and direction of skew has been reduced compared to the result shown in FIG. 5A.

FIG. 5C illustrates a contour graph of nitrogen dosage after a medium dose nitridation process similar to the process shown in FIG. 5A after raising the coil assembly by 0.6 inch near the 9 O'clock position. As shown in FIG. 5C, the degree of skew has been increased compared to the result shown in FIG. 5A.

As illustrated from FIGS. 4A-4C and FIGS. 5A-5C, baseline skew may be a result of combination of process recipe and coil position. It is desirable to have an adjustable coil assembly, as described in embodiments of the present invention, to correct baseline skew for different process recipes.

While the foregoing is directed to embodiments of the present invention, other and further embodiments of the invention may be devised without departing from the basic scope thereof, and the scope thereof is determined by the claims that follow.

What is claimed is:

1. An apparatus configured for processing a substrate, comprising:
   a chamber body defining a process volume configured to process the substrate therein, wherein the chamber body comprises a chamber lid; and
   a coil assembly coupled to the chamber lid outside the process volume, wherein the coil assembly comprises:
      a cylindrical sidewall coupled to the chamber lid, wherein the cylindrical sidewall has a flange;
      a tilting ring having a variable thickness rotatably disposed on the flange of the cylindrical sidewall;
      a coil mounting plate coupled to the tilting ring; and
      a first coil antenna mounted on the coil mounting plate within an inner volume defined by the cylindrical sidewall, the coil mounting plate and the chamber lid, wherein a tilting angle of the coil mounting plate and the alignment of the first coil antenna relative to the process volume are adjustable by rotation of the tilting ring.

2. The apparatus of claim 1, wherein the tilting ring is a stacked ring comprising:
   an upper ring having a variable thickness; and
   a lower ring having a variable thickness stacked below the upper ring, wherein the upper ring is coupled to the coil mounting plate and the lower ring is coupled to the flange of the cylindrical sidewall, thickness variation of the stacked ring is adjustable by rotating the upper ring and the lower ring relative to each other, and the mounting angle of the coil mounting plate is adjustable by rotating the upper ring and the lower ring relative to each other or together.

3. The apparatus of claim 2, wherein the upper ring and the lower ring have a plurality of locking holes formed therein, and the plurality of locking holes are used to secured the relative position of the upper ring and the lower ring.

4. The apparatus of claim 2, wherein the coil assembly further comprises a second coil antenna mounted on the coil mounting plate, wherein the second coil antenna is positioned radially inward of the first coil antenna.

5. The apparatus of claim 4, wherein the coil assembly further comprises a first plurality of coil hangers coupled to the coil mounting plate and extending downward towards the chamber lid, the first plurality of coil hangers form a first circle, and the first coil antenna winds around the first plurality of coil hangers.

6. The apparatus of claim 5, wherein the coil mounting plate include a plurality of coil mounting holes arranged in a plurality of substantially concentric circles, and each of the first plurality of coil hangers is coupled to a coil mounting hole.

7. The apparatus of claim 6, wherein the coil assembly further comprises a second plurality of coil hangers coupled to the coil mounting plate and extending downward towards the chamber lid, the second plurality of coil hangers form a second circle substantially concentric to the first circle, and the second coil antenna winds around the second plurality of coil hangers.

8. The apparatus of claim 2, wherein a thickness of each of the upper ring and lower ring changes gradually along a periphery.

9. The apparatus of claim 8, wherein a diameter of the stacked ring is about 15 inches and the thickness variation of the stacked ring is between 0 inch to about 1 inch.

10. The apparatus of claim 2, wherein an intersection of the upper ring has a vertical portion and a horizontal portion, the vertical portion extends downwards from an inner diameter of the horizontal portion, the lower ring is disposed against the horizontal portion of the upper ring radially outward from the vertical portion of the upper ring, and the vertical portion of the upper ring shields the lower ring from the inner volume.

11. The apparatus of claim 10, wherein the upper ring has a plurality of upper locking holes formed through the horizontal portion, the lower ring has a plurality of lower locking holes, and each of the upper locking holes and each corresponding lower locking are configured to accommodate a locking screw therein.

12. The apparatus of claim 1, wherein the first coil antenna comprises a plurality of interleaved conductors defining a vertical right circular cylinder or imaginary cylindrical surface or locus having an axis of symmetry substantially coinciding with an axis of symmetry of the processing volume.

13. An apparatus for processing a semiconductor substrate, comprising:
   a chamber body defining a process volume configured to process the semiconductor substrate therein; and
   a coil assembly coupled to the chamber body outside the process volume, wherein the coil assembly comprises:
      a cylindrical sidewall coupled to the chamber body;
      a coil mounting plate;
      a tilting ring having a gradually variable thickness rotatably disposed between the coil mounting plate and the cylindrical sidewall, wherein the cylindrical sidewall, the coil mounting plate, and the tilting ring enclose a coil volume above the chamber body, and a tilting angle of the coil mounting plate is adjustable by rotating of the tilting ring;
      an inner coil mounted to the coil mounting plate in the coil volume; and
      an outer coil mounted to the coil mounting plate in the coil volume, wherein the outer coil is positioned concentrically outward to the inner coil wherein the tilting angle of the mounting plate affects alignment of at least one of the inner coil and the outer coil relative to the process volume.

14. The apparatus of claim 13, wherein the tilting ring comprises:
an upper ring having a variable thickness; and
a lower ring having a variable thickness, wherein the upper ring and the lower ring a stacked together to form a stacked ring, and thickness variation of the stacked ring is adjustable by rotating the upper ring and the lower ring relative to each other.

15. The apparatus of claim 13, wherein each of the inner coil and the outer coil comprises a plurality of interleaved conductors defining a vertical right circular cylinder or imaginary cylindrical surface or locus having an axis of symmetry substantially coinciding with an axis of symmetry of the processing volume.

16. The apparatus of claim 13, wherein the inner coil has a diameter of about 5 inches, and the outer coil has a diameter of about 20 inches.

17. The apparatus of claim 13, wherein the coil assembly further comprises:
a first plurality of coil hangers coupled to the coil mounting plate and extending downward towards the chamber body, the first plurality of coil hangers form a first circle, and the first coil antenna winds around the first plurality of coil hangers; and
a second plurality of coil hangers coupled to the coil mounting plate and extending downward towards the chamber body, the second plurality of coil hangers form a second circle substantially concentric to the first circle, and the second coil antenna winds around the second plurality of coil hangers.

18. The apparatus of claim 13, wherein an intersection of the upper ring has a vertical portion and a horizontal portion, the vertical portion extends downwards from an inner diameter of the horizontal portion, the lower ring is disposed against the horizontal portion of the upper ring radially outward from the vertical portion of the upper ring, and the vertical portion of the upper ring shields the lower ring from the inner volume.

19. The apparatus of claim 18, wherein the upper ring has a plurality of upper locking holes formed through the horizontal portion, the lower ring has a plurality of lower locking holes, and each of the upper locking holes and each corresponding lower locking are configured to accommodate a locking screw therein.

* * * * *